United States Patent
Dawson-Elli et al.

(10) Patent No.: US 6,736,633 B1
(45) Date of Patent: May 18, 2004

(54) BURNER MANIFOLD APPARATUS FOR USE IN A CHEMICAL VAPOR DEPOSITION PROCESS

(75) Inventors: David F. Dawson-Elli, Shrewsbury, MA (US); Xiaodong Fu, Painted Post, NY (US); Daniel W. Hawtof, Painted Post, NY (US); William J. Kiefer, Horseheads, NY (US); John F. Wight, Jr., Corning, NY (US); John Stone, III, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 09/830,512

(22) PCT Filed: Dec. 1, 1999

(86) PCT No.: PCT/US99/28305

§ 371 (c)(1), (2), (4) Date: Apr. 25, 2001

(87) PCT Pub. No.: WO00/36340

PCT Pub. Date: Jun. 22, 2000

Related U.S. Application Data

(60) Provisional application No. 60/112,767, filed on Dec. 17, 1998.

(51) Int. Cl.[7] .............................................. F23D 14/00
(52) U.S. Cl. ........................... 431/328; 431/326; 431/7; 239/418; 239/548; 239/552; 239/568; 239/543; 239/553.5
(58) Field of Search .................. 431/7, 326, 328; 239/418, 422, 548, 552, 566, 568, 543, 553.5, 553.3; 425/308, 376.1, 382 R, 465, 466

(56) References Cited

U.S. PATENT DOCUMENTS 1,289,992 A * 12/1918 Willson .................. 239/553.3
1,498,644 A * 6/1924 Clark ......................... 239/552
1,998,300 A * 4/1935 Ackermann ................. 239/273

(List continued on next page.)

FOREIGN PATENT DOCUMENTS

| FR | 328947 | * 1/1903 | .................. 239/552 |
| SU | 0676817 | * 7/1979 | .................. 239/432 |
| WO | WO 97/22553 | 6/1997 | ........... C01B/33/12 |
| WO | WO 99/32410 | 7/1999 | ............. C03B/8/04 |
| WO | WO 99/55460 | 11/1999 | ............. B01L/3/02 |

*Primary Examiner*—Carl D. Price
(74) *Attorney, Agent, or Firm*—Robert L. Carlson

(57) ABSTRACT

A burner manifold apparatus (10) for delivering reactants to a combustion site of a chemical vapor deposition process includes fluid inlets (32a, 32b), fluid outlets (49), and a plurality of fluid passages (50) extending therebetween. The fluid passages (50) converge toward each other from the fluid inlets to the fluid outlets. One embodiment includes a manifold base (12), a pressure plate (14), and a manifold burner mount (16) for mounting thereto a micromachined burner (58). The fluid passages (50) internal to the manifold base are configured to distribute symmetrically the fluid to the manifold burner mount. The fluid is then channeled through fluid passages in the manifold burner mount. The fluid passages converge, yet remain fluidly isolated from each other, and the fluid passages create a linear array for producing linear streams of fluid. Alternatively, the burner manifold apparatus may include a plurality of manifold elements in a stacked arrangement. In this alternative embodiment, the manifold elements are configured to produce a linear array of fluid passages at the top of the stack, increasing the number of fluid passages at each level of the stack closer to the top. As yet a further alternative, the burner manifold may be produced by extruding a particulate composite through a die to produce a manifold having fluid passages therein. This extruded manifold generally has a tapered section to which a burner may be mounted.

51 Claims, 7 Drawing Sheets

U.S. PATENT DOCUMENTS

| | | | |
|---|---|---|---|
| 2,054,601 A | 9/1936 | Jenkins | 158/27.4 |
| 2,496,923 A | 2/1950 | Walters et al. | 158/27.4 |
| 3,320,044 A * | 5/1967 | Cole et al. | 65/44 |
| 3,324,924 A * | 6/1967 | Hailstone et al. | 431/328 |
| 3,872,564 A * | 3/1975 | Myers et al. | 428/593 |
| 3,963,504 A * | 6/1976 | Lundsager | 501/82 |
| 4,192,460 A | 3/1980 | Matsuo | 239/79 |
| 4,448,833 A * | 5/1984 | Yamaguchi et al. | 428/116 |
| 4,556,543 A * | 12/1985 | Mochida et al. | 422/171 |
| 4,765,540 A * | 8/1988 | Yie | 239/8 |
| 4,821,963 A | 4/1989 | Arnout et al. | 239/419.3 |
| 5,393,587 A * | 2/1995 | Machida et al. | 428/116 |
| 5,472,143 A * | 12/1995 | Bartels et al. | 239/462 |
| 5,599,371 A * | 2/1997 | Cain et al. | 65/413 |
| 5,633,066 A * | 5/1997 | Lipp et al. | 428/116 |
| 5,683,516 A | 11/1997 | DeDontney et al. | 118/718 |
| 5,774,779 A * | 6/1998 | Tuchinskiy | |
| 6,299,958 B1 | 10/2001 | St. Julien et al. | 428/73 |

* cited by examiner

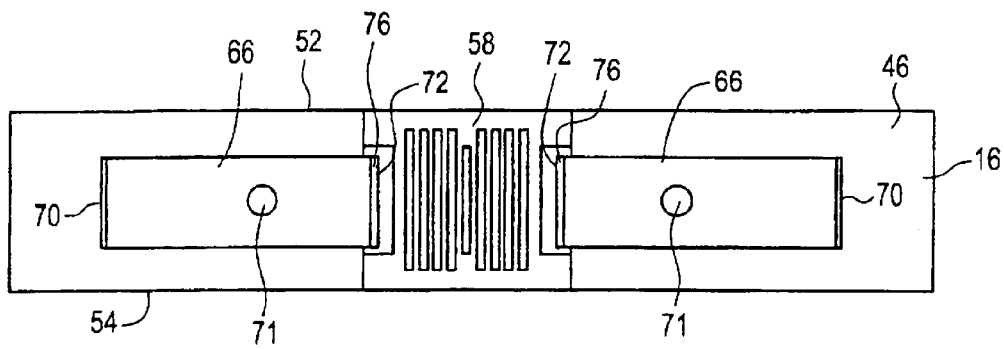
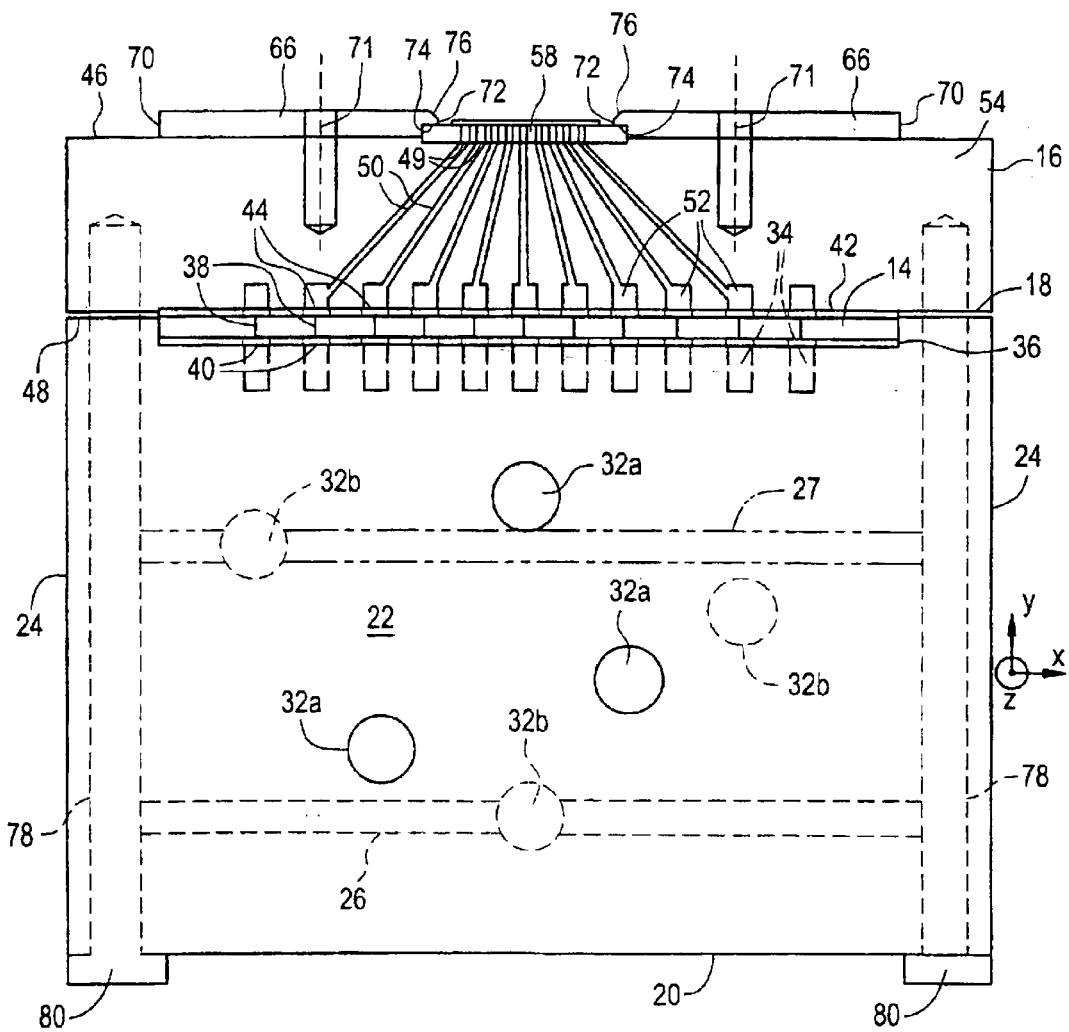

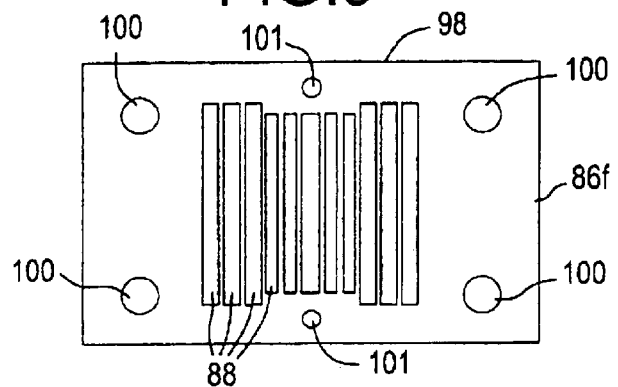
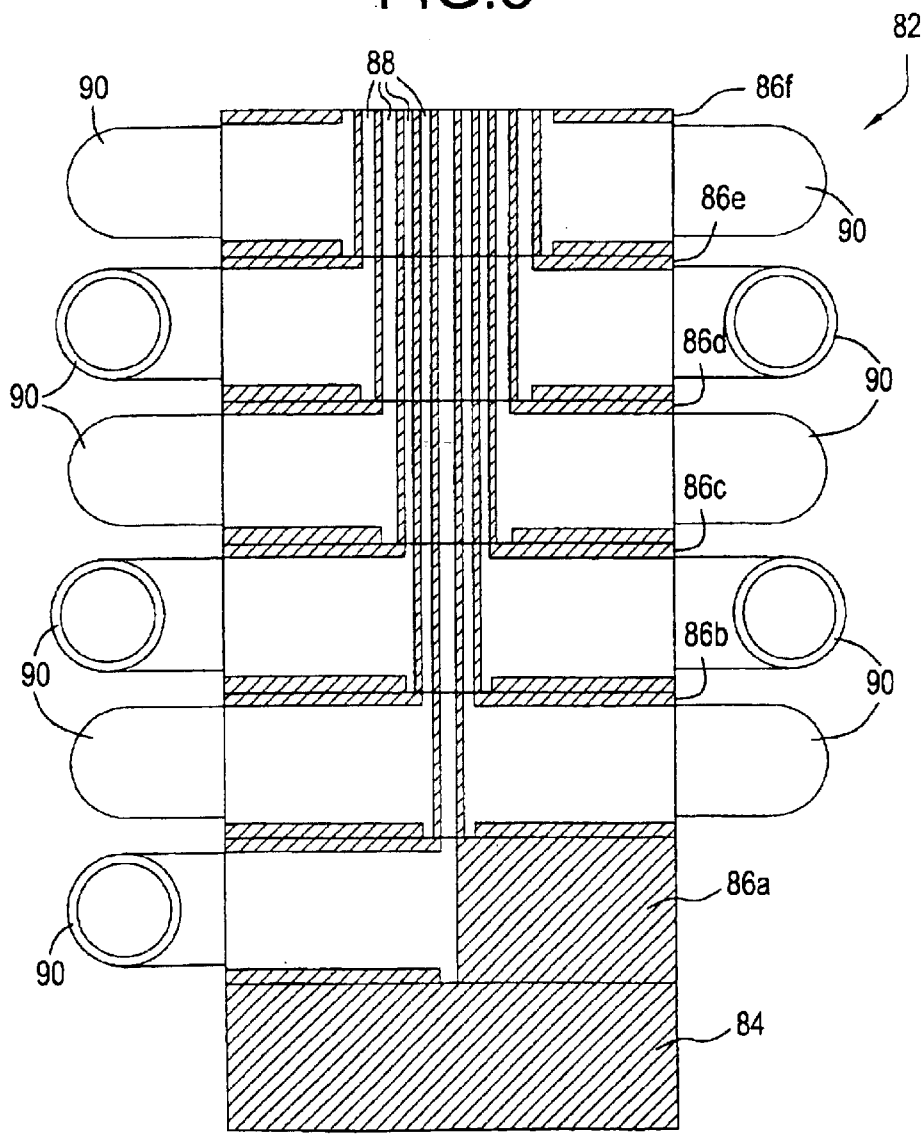

BURNER MANIFOLD APPARATUS FOR USE IN A CHEMICAL VAPOR DEPOSITION PROCESS

This appl. claims benefit of Provisional Appl. 60/112,767, filed Dec. 17, 1998.

BACKGROUND OF THEN INVENTION

This invention relates to novel burner manifold apparatuses. More particularly, this invention relates to burner manifold apparatuses for micromachined burners, such as micromachined silicon burners.

It is known to form various articles, such as crucibles, tubing, lenses, and optical waveguides, by reacting a precursor in the flame of a burner to produce a soot and then depositing the soot on a receptor surface. This process is particularly useful for the formation of optical waveguide preforms made from doped and undoped silica soot, including planar waveguides and waveguide fibers.

The waveguide formation process generally involves reacting a silicon-containing precursor in a burner flame generated by a combustible gas, such as a mixture of methane and oxygen, and depositing the silica soot on an appropriately shaped receptor surface. In this process, silicon-containing materials typically are vaporized at a location remote from the burner. The vaporized raw materials are transported to the burner by a carrier gas. There, they are volatilized and hydrolyzed to produce soot particles. The soot particles then collect on the receptor surface. The receptor surface may be a flat substrate in the case of planar waveguide fabrication, a rotating starting rod (bait tube) in the case of vapor axial deposition (VAD) for waveguide fiber fabrication, or a rotating mandrel in the case of outside vapor deposition (OVD) for waveguide fiber fabrication.

Numerous burner designs have been developed for use in vapor delivery precursor processes, and at least one liquid delivery precursor process has been contemplated, as disclosed in co-pending application Ser. No. 08/767,653 to Hawtof et al, incorporated herein by reference. Whether the precursor is delivered to the burner in vapor form or liquid form, it is important that the burner receives a distributed, even stream of precursor. This consideration is particularly important during waveguide manufacture to form accurate refractive index profiles.

In the recent past, burners for deposition of metal oxide soot have been proposed having orifices and supply channels on a small scale. The channels and orifices in these burners may have widths or diameters less than 150 microns, for example, as disclosed in commonly-owned provisional application Ser. No. 60/068,255 entitled "Burner and Method For Producing Metal Oxide Soot," incorporated herein by reference.

As a result, there has arisen a need for a burner manifold that may be used in conjunction with these micromachined burners and may distribute fluid uniformly and evenly to the burners. In conventional large-scale burners, this uniformity was achieved by equally large concentric rings. This solution, however, is not practical for use with micromachined burners.

SUMMARY OF THE INVENTION

With the advent of micromachined burners, it is desirable to have a burner manifold apparatus that evenly and uniformly distributes fluid (either vapor or liquid) to the micromachined burners.

A burner manifold apparatus in accordance with the present invention comprises fluid inlets, fluid outlets, and a plurality of fluid passages. The fluid passages extend between the fluid inlets and the fluid outlets to deliver reactants to the combustion site of a chemical vapor deposition process. The fluid passages converge toward each other from the fluid inlets to the fluid outlets in that inlets of the fluid passages are spaced farther apart than outlets of the fluid passages. This arrangement facilitates delivery of reactant precursor fluid from a macro scale delivery system to a micro scale burner. The fluid passages preferably have a smaller cross-sectional area at their outlet than at their inlet.

The fluid passages generally are isolated from one another so that some fluid passages transport reactant precursor materials and other fluid passages transport combustion materials. The fluid passages at the fluid outlets are preferably shaped to match the geometry of the burner. In a preferred embodiment, the fluid outlets are slot shaped or formed as a series of in-line round holes.

The burner manifold apparatus further includes at least one pressure inducing restriction device for passing fluid therethrough in evenly distributed, narrow elongated streams. The pressure inducing restriction device is positioned between the fluid inlets and the fluid outlets. The pressure inducing restriction device preferably comprises a plate having a series of slots or linearly arrayed apertures for emitting fluid therefrom in generally linear streams of droplets.

One embodiment of the present invention includes a manifold base having a top, a bottom, a front wall, a back wall, and two side walls. The manifold base defines horizontal passages therethrough that extend between the side walls, vertical passages extending from a position within the manifold base to the top of the manifold base, and fluid inlet ports. Each fluid inlet port is located on either the front wall or the back wall of the manifold base, and each is in fluid communication with at least one of the horizontal and vertical passages. The horizontal passages preferably are parallel to the top and the bottom of the manifold base, and the vertical passages preferably are parallel-to the side walls of the manifold base.

The burner manifold apparatus of the first embodiment also includes a plate mounted to the top of the manifold base. The plate defines a plurality of apertures therethrough. At least one aperture is positioned at a location above an exit of each of the vertical passages of the manifold base to allow passage of fluid from the vertical passages through the plate.

The vertical passages of the manifold base are symmetric about a first axis bisecting the top of the manifold base. The vertical passages preferably include a central vertical passage and pairs of vertical passages, each pair defined by two vertical passages spaced equidistant from the first axis. Each pair intersects a particular horizontal passage to create an array of passages within the manifold to distribute fluid symmetrically about the first axis.

The apparatus of the first embodiment further includes a manifold burner mount mounted to the top of the plate. The manifold burner mount defines fluid passages that extend from a bottom of the manifold burner mount to a top of the manifold burner mount. These fluid passages are arranged to converge such that a distance between adjacent fluid passages is greater at the inlet of the manifold burner mount than at the outlet of the manifold burner mount.

The burner manifold apparatus further comprises a first gasket positioned between the manifold base and the plate. The first gasket has slots therein in alignment with grooves in the top of the manifold base. A second gasket preferably is positioned between the plate and the manifold burner mount. This second gasket has slots in alignment with the slots in the first gasket. A burner gasket may be placed upon the manifold burner mount. The burner gasket has slots in alignment with the exits of the fluid passages in the manifold burner mount.

Securing elements, such as clamps, may be mounted to the top of the manifold burner mount for releasably securing a burner to the manifold burner mount. The clamps each have an outer edge and an inner edge, and the inner edge has a shoulder that engages the burner. Further, the inner edge of each clamp has a tapered surface that tapers away from the top of the manifold burner mount.

A second embodiment of the subject burner manifold apparatus includes a plurality of manifold elements positioned in a stacked arrangement on top of a base element. The manifold elements fluidly communicate with each other via fluid passages therein. Each of the manifold elements has a different number of fluid passages, preferably increasing by two for each successive element located higher on the stack. These fluid passages converge toward each other at the outlet of the manifold apparatus. Each of the manifold elements has at least one fluid inlet port, and preferably two, with the exception of the lowermost manifold element.

The fluid passages preferably are linear and extend vertically through the manifold elements. The outermost fluid passages of each of the manifold elements communicate with a fluid inlet port, and inner fluid passages are isolated from the outermost fluid passages to isolate the fluids introduced into different manifold elements. The fluid passages of adjacent manifold elements are in vertical alignment. Like the fluid passages in the burner mount of the first embodiment, the fluid passages of this second embodiment are symmetric about a central fluid passage.

Gaskets are disposed between adjacent ones of the manifold elements. The gaskets have slots therethrough to allow passage of fluid. The gaskets preferably are formed from an elastomer material.

In a third embodiment of the invention, the burner manifold comprises a tapered section having a first end and a second end, where the first end has a larger surface area than the second end. The fluid inlets are located at the first end of the manifold, and the fluid outlets are located at the second end of the manifold. The tapered section preferably has a truncated cone shape.

The burner manifold may also comprises a top section coextensive with the tapered section. The top section has a first end adjoining the second end of the tapered section, and a second end for carrying a burner.

The tapered section and the top section of this third embodiment define a plurality of fluid passages therethrough to convey fluid from the first end of the tapered section to the second end of the top section. In a preferred embodiment, the fluid passages run generally parallel to each other and converge toward each other from the fluid inlets at the first end of the tapered section to the fluid outlets at the second end of the top section. Selected ones of the fluid passages may be blocked or plugged to select, by elimination, which passages provide fluid flow.

In this third embodiment, the burner manifold is formed by an extrusion process. The burner manifold tapers from a first end to a second end or, alternatively, has a tapered section located between the first end and the second end. This can be done, for example, by plastically transforming a preform of parallel channels (honeycomb substrate) into a funnel of funneling channels. Two suitable transforming processes are hot draw down and reduction extrusion. "Hot draw down" is a viscous forming process carried out on viscously sintered preforms and is described in commonly-owned U.S. patent application Ser. No. 09/299,766 entitled "Redrawn Capillary Imaging Reservoir", the specification of which is hereby incorporated herein by reference. "Reduction extrusion" is a plastic forming process carried out on unsintered particulate preforms as illustrated in Corning's U.S. Pat. No. 6,299,958 entitled "Manufacture of Cellular Honeycomb Structures", the specification of which is hereby incorporated herein by reference. Particulates of metal, plastic, ceramic and/or glass are compounded and extruded to make the preform. The top section of the manifold may be cylindrical, rectangular, or any other shape suitable for carrying a burner.

A fourth embodiment of the invention includes a plurality of burner mounts, a plurality of plates, and a single manifold base. The manifold has a thickness dimension between the front wall and the back wall that is greater than a thickness dimension of the burner mounts and the plates such that a plurality of burner mount/plate combinations may be mounted to the manifold.

The burner manifold apparatus of the present invention achieves a number of advantages over conventional burner manifolds. For example, the burner manifold apparatus bridges the gap between the conventional "macro" world of manifolds and the "micro" world of micromachined silicon wafer burners.

Another advantage is that the burner manifold apparatus is capable of use in conjunction with a burner having a linear flame array that evenly distributes fluid through the manifold and to either side of the burner's linear flame array.

Still another advantage is that the burner manifold apparatus may securely and precisely mount a micromachined burner wafer in place.

A further advantage is that the burner manifold apparatus may be arranged adjacent other assemblies to form an array of adjacent burners, which generate closely adjacent burner flames.

Yet a further advantage is that the burner manifold apparatus may be produced by an extrusion process or, alternatively, a hot draw down process.

Still a further advantage of the burner manifold apparatus is that the burner may be mounted to the burner mount by an anodic bond, without the need for clamps or other mechanical attachment means.

The manifold of the present invention also enables and facilitates the use of miniature micromachined burners in applications for depositing silica soot, in particular for making high purity soot for optical waveguide manufacturing processes.

Additional advantages of the invention will be set forth in the description which follows, and in part will be obvious from the description, or may be learned by practice of the invention. The advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and, together with the general description given above and the detailed description of the preferred embodiment given below, serve to explain the principles of the invention.

FIG. 2 is a side elevation view, in partial cross section, of the burner manifold apparatus and a micromachined burner wafer in accordance with the invention;

FIG. 3 is a top plan view of the burner manifold apparatus, with a burner mounted thereto, in accordance with the invention;

FIG. 8 is a side elevation view, in cross section, of apparatus parts of the burner manifold apparatus shown in FIG. 7, with fluid fittings;

FIG. 9 is a top plan view of the burner manifold apparatus shown in FIG. 7;

DETAILED DESCRIPTION OF THE PREFERRED EMBODIMENTS

Micromachined burners, such as those disclosed in commonly-owned provisional application Ser. No. 60/068, 255 to Hawtof et al., have stimulated the need for a new, sophisticated burner manifold apparatus for manifolding the flow of fluid to the micromachined burners. These micromachined burners are typically constructed as wafers and are fabricated on a small scale. For example, burners used for the production of silica soot for waveguide fiber preform may be approximately 1 inch long by 1 inch wide. The length and width of the burners can be smaller or larger, limited by semiconductor wafer fabrication procedures.

These wafer burners are fabricated with precision channels or orifices having widths or diameters, respectively, typically smaller than 150 microns, and in some embodiments, smaller than 10 microns. The channels or orifices preferably are micromachined in a linear array through the burner. Such micromachining can be achieved using conventional techniques used in the fabrication of integrated circuits, such as lithography, masking, etching, photochemical processes, reactive ion etching (RIE), ultrasonic machining, vertical wall micromachining, and crystallographic etching. The specific technique used depends on the burner material, particularly the crystal structure and orientation.

Since micromachined burners are much smaller than conventional burners and are linearly symmetric about their center, conventional manifolds do not work. A need has arisen for a burner manifold suited to the new "micro" world of linearly arrayed wafer burners, representing a significant change from the conventional "macro" world of relatively large, ringed burners.

The burner manifold apparatus of the present invention includes fluid inlets, fluid outlets, and a plurality of fluid passages extending between the fluid inlets and the fluid outlets. The fluid passages converge toward each other from the fluid inlets to the fluid outlets. For example, with fluid passages of a rectangular cross section, the longitudinal axes of the fluid passage cross sections are spaced farther apart at the inlet end of the passages than at the outlet end to facilitate delivery of precursor reactants from a macro scale delivery system to the preferred micro burner. In this way, the wider spaced inlets facilitate easy piping, whereas the closely spaced outlets enable alignment with the orifices of a miniature burner. Likewise, the fluid passages preferably have a smaller cross-sectional area at the fluid outlets than at the fluid inlets. Thus, the burner manifold apparatus is particularly suited for use with a micromachined burner.

Figure 1:
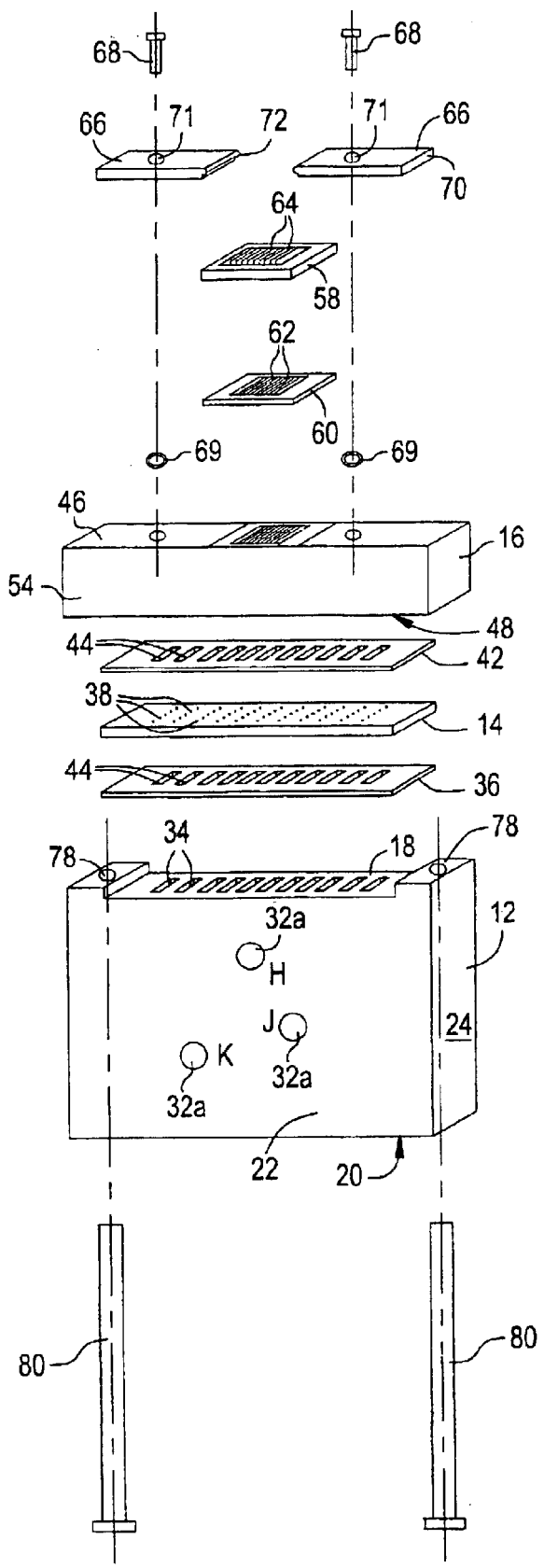
FIG. 1 is an exploded perspective view of a burner manifold apparatus for use with a micromachined burner wafer in accordance with the invention.

Referring now to the drawings, wherein like numerals indicate like parts, and initially to FIG. 1, there will be seen a first embodiment of a burner manifold apparatus, generally indicated 10, in accordance with the invention. The burner manifold apparatus 10 generally includes a manifold base 12, a pressure plate 14, and a manifold burner mount 16. The manifold base 12 illustrated in FIG. 1 has a top 18, a bottom 20, a front wall 22, a back wall 23 (in FIG. 4), and side walls 24. Horizontal passages, such as passages 26 and 27 (see FIGS. 2 and 5), extend between the side walls 24 of the manifold base 12. The manifold base 12 also has vertical passages 30a–30f (see FIGS. 4–5) extending from a position within the manifold base 12 to the top 18 of the manifold base 12. With the exception of a central vertical passage 30a, each vertical passage 30b–30f intersects and extends upward from a particular horizontal passage, as will be explained below in more detail.

It will be understood that the horizontal and vertical passages may be constructed such that the horizontal and vertical passages are not perpendicular to each other. Moreover, whereas the horizontal and vertical passages illustrated are preferably linear, they may also be constructed with curvatures and undulations.

The manifold base 12 further has fluid inlet ports 32a, 32b located on either the front wall (32a) or the back wall (32b). The fluid inlet ports serve as ports for fluid lines to introduce vapors and/or liquids into the manifold. Each fluid inlet port fluidly communicates with at least one of the horizontal and vertical passages. The horizontal passages, the vertical passages, and the fluid inlet ports intersect with each other to facilitate symmetric distribution of fluid within the manifold.

Figure 4:
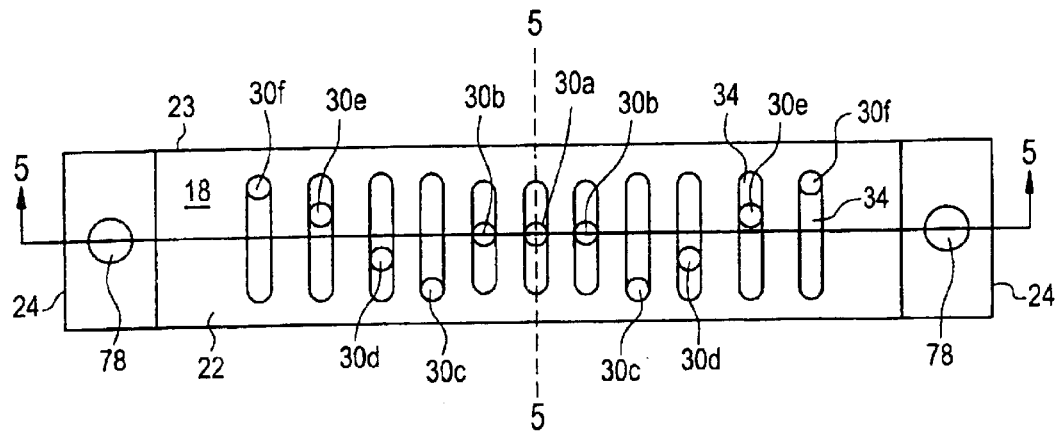
FIG. 4 is a top plan view of a burner manifold of the burner manifold apparatus in accordance with the invention.
Figure 5:
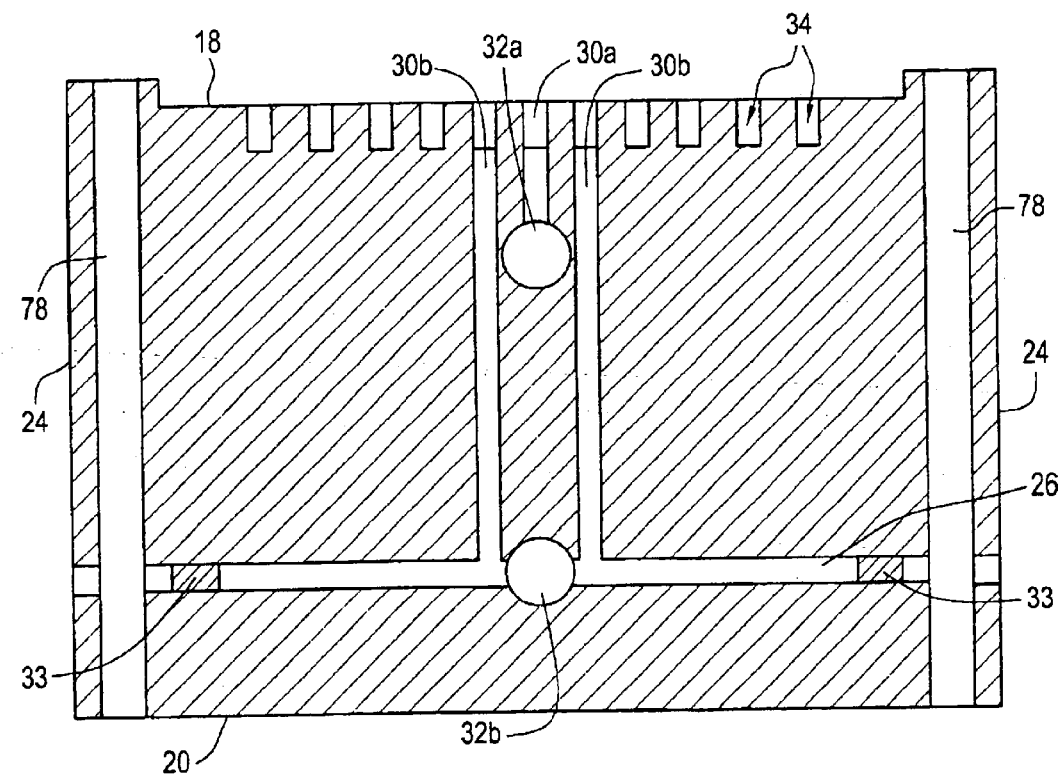
FIG. 5 is a side elevation view, in cross section, of the burner manifold along section line B—B in FIG. 4.

Turning to FIGS. 2, 4, and 5, the vertical passages 30a–30f are symmetric about a first axis A—A bisecting the top 18 of the manifold base 12. The vertical passages include a central passage 30a and pairs of vertical passages 30b–30f Each pair 30b–30f is defined by two vertical passages that are spaced equidistant from the first axis A—A to distribute fluid symmetrically about the first axis A—A. Each pair 30b–30f intersects a particular horizontal passage to create an array of fluid passages within the manifold base 12. In another embodiment, the pairs 30b–30f may be symmetric about a central passage 30a that lies off of the first axis A—A.

The vertical passages 30b–30f are located at different cross-sectional planes within the manifold, where the planes are defined parallel to section line B—B and extend through the manifold top-to-bottom. Vertical passages 30a and 30b fall on the same plane, as shown in FIG. 4. The vertical passage 30a and pair 30b are located on section line B—B; pairs 30c and 30d are offset from section line B—B, closer to the front wall 22 of the manifold base 12; and pairs 30e and 30f are offset from section line B—B, closer to the rear wall 23 of the manifold base 12. The vertical passages 30b–30f (and their associated horizontal passages) are fluidly independent from each other so that, for example, a first fluid can be piped through vertical passages 30b and a second fluid can be piped through vertical passages 30c. One of skill in the art will recognize that the exact placement of the vertical passages at various planes within the manifold base 12 can be altered, as long as their symmetry about the first axis A—A is maintained.

As to the horizontal passages, such as passages 26 and 27, they are located at different heights in the manifold base 12 and span the manifold base 12 between the side walls 24. The height location of the horizontal passages is marked by the location of the fluid inlet ports 32a, 32b shown in FIG. 2. For example, FIG. 2 shows a horizontal passage 26 located at a height marked by lowermost inlet port 32b and a horizontal passage 27 located at a height marked by another higher inlet port 32b. Each horizontal passage is fed by a single fluid inlet port 32a, 32b. Put another way, each fluid inlet port 32a, 32b intersects a particular horizontal passage, with the exception of the fluid inlet port that intersects central vertical passage 30a (and that fluid inlet port is shown as the topmost of inlet ports 32a in FIG. 2). By virtue of this arrangement, a single fluid feed line splits the fluid internally in the manifold for even distribution between two vertical passages located equidistant from the central vertical passage 30a.

We have shown only two representative horizontal passages in FIG. 2, although there are five horizontal passages in a preferred embodiment of the manifold base 12, located at heights marked by the five lower inlet ports 32a, 32b. We have illustrated the horizontal passages 26 and 27 with different dashed line styles to emphasize that the horizontal passages lie in different front-to-back planes within the manifold base 12. For example, horizontal passage 26 lies at the central plane defined by section line B—B in FIG. 4. Horizontal passage 27, which, in this embodiment of the invention, fluidly communicates with the vertical passages 30f, lies in a plane closer to the back wall 23 of the manifold base 12.

In addition, the vertical passages 30b–30f are not of a uniform length. Rather, the length of the vertical passages 30b–30f varies, depending upon which horizontal passage the vertical passages 30b–30f intersect. For example, as shown in FIG. 2, the vertical passages 30f, which intersect the horizontal passage 27, will be shorter than the vertical passages 30b, which intersect the horizontal passage 26.

In slightly different term s than presented above, the orientation of the passages and ports in the manifold may be described by reference to an x-y-z coordinate system (shown beside FIG. 2). The vertical passages 30a–30f extend in the y-direction and shift along both the x-axis and the z-axis relative to each other. The horizontal passages, for example 26 and 27 in FIG. 2, extend in the x-direction and shift along both the y-axis and the z-axis relative to each other. Finally, the fluid inlet ports 32a, 32b extend along the z-axis and shift along both the x-axis and the y-axis relative to each other.

To prevent the flow of fluid out of the manifold, the horizontal passages are fitted on either end with plugs 33, as shown in FIG. 5.

The invention thus provides an intricate and effective array of fluid passageways within the manifold base that ensures an even distribution of the various fluids introduced through the inlet ports to both sides of the first axis A—A.

The top 18 of the manifold base 12 includes grooves 34 positioned above the exits of the vertical passages 30a–30f. The grooves 34 are elongate and extend in a direction parallel to the side walls 24 of the manifold base 12. The grooves 34 represent the spaced apart locations of the inlets of the fluid passages in that the vertical passages 30a–30f are fluid inlets.

Figure 6:
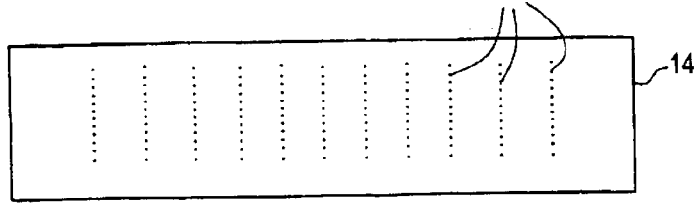
FIG. 6 is a top plan view of a pressure plate of the burner manifold apparatus in accordance with the invention.

A pressure plate 14, a top plan view of which is shown in FIG. 6, rests atop the manifold base 12. The pressure plate 14 is separated from the manifold base 12 by a first gasket 36, as shown in FIG. 1. To allow the passage of fluid from the manifold base 12 to the pressure plate 14, the first gasket 36 includes slots 40 that are in alignment with the grooves 34 of the top 18 of the manifold base 12. The pressure plate 14 in turn includes an array of apertures 38 in alignment with the grooves 34. The apertures 38 are smaller in size than the exits of the vertical passages 30a–30f. These apertures 38 are small enough to create a high back pressure and equalize the fluid flow through the apertures on either side of the first axis A—A For example, with vertical passages 30f, the associated fluid inlet port 32b is closer to the left passage 30f than the right passage 30f. The pressure plate 14 ensures that fluid introduced through inlet port 32b, which, unhindered, would migrate up the left passage 30f more quickly than up the right passage 30f, disperses evenly between the two passages. The pressure plate 14 in effect blocks the rapid exit of fluid from the manifold base 12 via a path of least resistance. Thus, fluid exits the manifold base 12 through the pressure plate 14 in a substantially uniform fashion through each of the apertures 38, symmetrically about the first axis A—A, and at a substantially constant pressure.

In the embodiment illustrated, the top 18 of the manifold base 12 has a cut-out, sized to accommodate the first gasket 36, the pressure plate 14, and at least a portion of a second gasket 42, as best seen in FIG. 2. The second gasket 42 separates the pressure plate 14 from the manifold burner mount 16. Like the first gasket 36, the second gasket 42 has slots 44. These slots 44 are in alignment with the slots 40 of the first gasket 36, and thus with the grooves 34 in the manifold base 12 and the aperture array 38 in the pressure plate 14.

The manifold burner mount 16 is positioned above the second gasket 42. The manifold burner mount 16 has a top 46 and a bottom 48 and includes fluid passages 50 that extend from top 46 to bottom 48. The entrances 52 to the fluid passages 50 from the second gasket 42 are in alignment with the slots 44 in the second gasket 42 and the apertures 38 in pressure plate 14. Fluid passing through the pressure plate 14 travels to the fluid passages 50 in the manifold burner mount 16. The fluid is symmetrically distributed at the time it passes through the pressure plate 14, and it remains evenly distributed as it passes through the manifold burner mount 16 to a micromachined burner mounted thereon. In the embodiment of FIG. 2, the two outermost vertical passages 30f are spare vertical passages and do not adjoin any fluid passages 50 in the burner mount; however, it will be understood that these outermost vertical passage 30f may be used with burner mounts having additional fluid passages.

As explained above, the manifold burner mount 16 is designed for use with a micromachined burner, preferably a micromachined burner having channels or orifices of a small scale. To facilitate this use, the fluid passages 50 are disposed such that the distance between adjacent fluid passages 50 is greater at the bottom 48 of the manifold burner mount 16 than at the top 46. The fluid passages 50 are preferably linear and converge, without intersecting, at the top 46 of the manifold burner mount 16, where they meet vertical passages extending through micromachined burner 58, as shown in FIG. 2. The orientation of the passages that extend through the burner 58 is shown in FIGS. 2 and 3.

Like the passages through the burner 58, the fluid passages 50 through the manifold burner mount 16 are generally rectangular, having a longitudinal axis extending between a back wall 52 and a front wall 54. The outlets 49 of the fluid passages 50 form a linear array, symmetric about a central fluid passage. This linear array produces one or more linear streams of fluid to the burner 58 mounted atop the manifold burner mount 16, and, when the fluid streams combine, the burner 58 generates a flame. The central fluid passage 50 is typically for the silica/dopant precursor materials (which can be liquid or vapor), and the remaining fluid passages 50 are for gases that react and combust with silica and dopants.

The unique structure of the manifold burner mount 16 bridges the gap between the "macro" world of manifold and the "micro" world of micromachined siliconized wafer burners. The outlets 49 of the fluid passages 50 converge such that they are spaced closer together than the inlets of the fluid passages 59 (and, hence, the vertical fluid passages 30a–30f).

The manifold burner mount 16 may be manufactured by plunge Electrical Discharge Machine (EDM) technology, either using a wire or a plunge which vaporizes the metal that comes into contact with the tip of the plunge.

The burner manifold apparatus 10 in accordance with this first embodiment further includes a burner gasket 60, which is mounted between the top 46 of the manifold burner mount 16 and the burner 58. The burner gasket 60 has slots 62 for alignment with the outlets of the fluid passages 50, including the central passage, in the manifold burner mount 16. These slots 62 are also aligned with the slots 64 that form the linear array in the burner 58. The top 46 of the manifold burner mount 16 has a cut-out for receiving the burner gasket 60 for accurate placement and alignment of the gasket 60.

The burner mount apparatus 10 in this first embodiment also includes burner securing elements 66 mounted on the top 46 of the manifold burner mount 16. The securing elements 66 secure the burner 58 and burner gasket 60 to the burner mount top 46. The securing elements 66 preferably comprise a pair of clamps releasably secured to the top 46 of the manifold burner mount 16 by screws 68 and spring rings 69. The spring rings 69 are positioned between the clamps 66 and the burner mount top 46. The clamps 66 have screw holes 71 for receiving the screws 68. The spring rings 69 have a slightly larger diameter than the holes 71 in the clamps 66 and the coextensive holes in the burner mount top 46.

The clamps 66 each have an outer edge 70 and an inner edge 72. The inner edge 72 of each clamp 66 has a downwardly facing shoulder 74, as shown in FIG. 2, which engages opposite sides of the burner 58 to clamp the burner 58 in place against the burner gasket 60. Above the shoulder 74, the inner edge 72 has a tapered surface 76 tapers away from the burner 58.

To secure the manifold burner mount 16 to the manifold base 12, the apparatus 10 includes channels 78 that extend completely through the manifold base 12, adjacent the side walls 24, and through at least a portion of the manifold burner mount 16. The apparatus 10 further includes screws 80 for receipt by the channels 78 to attach the manifold base 12 to the manifold burner mount 16.

Figure 13:
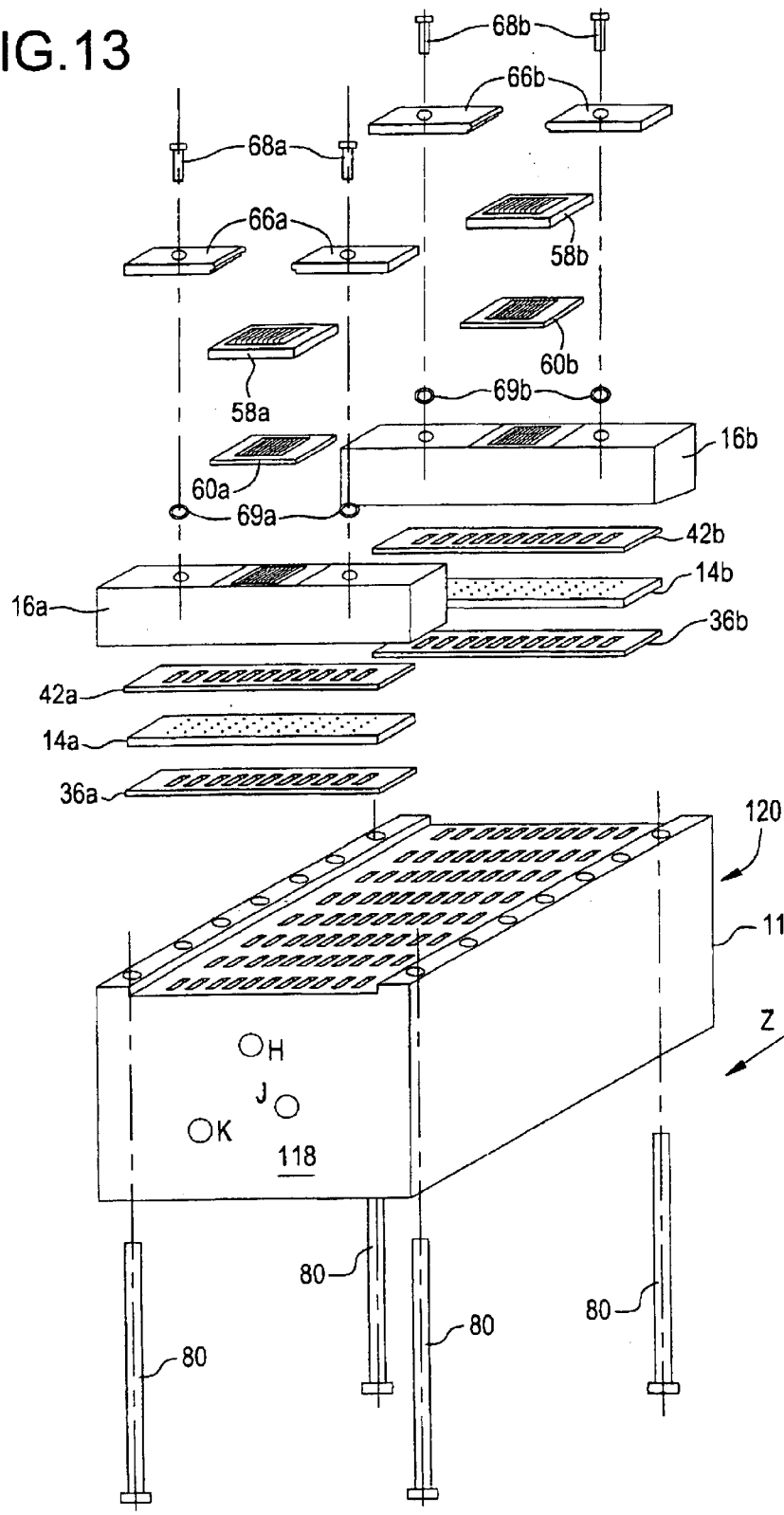
FIG. 13 is an exploded perspective view of a fourth embodiment of a burner manifold apparatus in accordance with the invention.

When completely assembled, the burner mount apparatus 10 has a generally rectangular configuration, with the thickness dimension from the front wall 22 to the back wall 23. As shown in FIG. 13, the manifold base 116 may be elongated in the z-direction such that several burners and burner mount assemblies may be mounted thereon, side by side. In a preferred embodiment, three fluid lines may be introduced at the front wall 118 and the back wall 120 of the burner manifold 116, totaling six fluid lines. The holes 32 extend between the front wall 118 and the back wall 120, feeding the several vertical passages 30a–30f in the manifold.

This embodiment enables efficient transference of fluid to several different burner mounts, resulting in several linear arrays of flame generated by the side by side burners. The fluids introduced into the manifold base 116 are distributed evenly throughout the manifold base 116, so that the burners produce essentially uniform burner flames.

Figure 7:
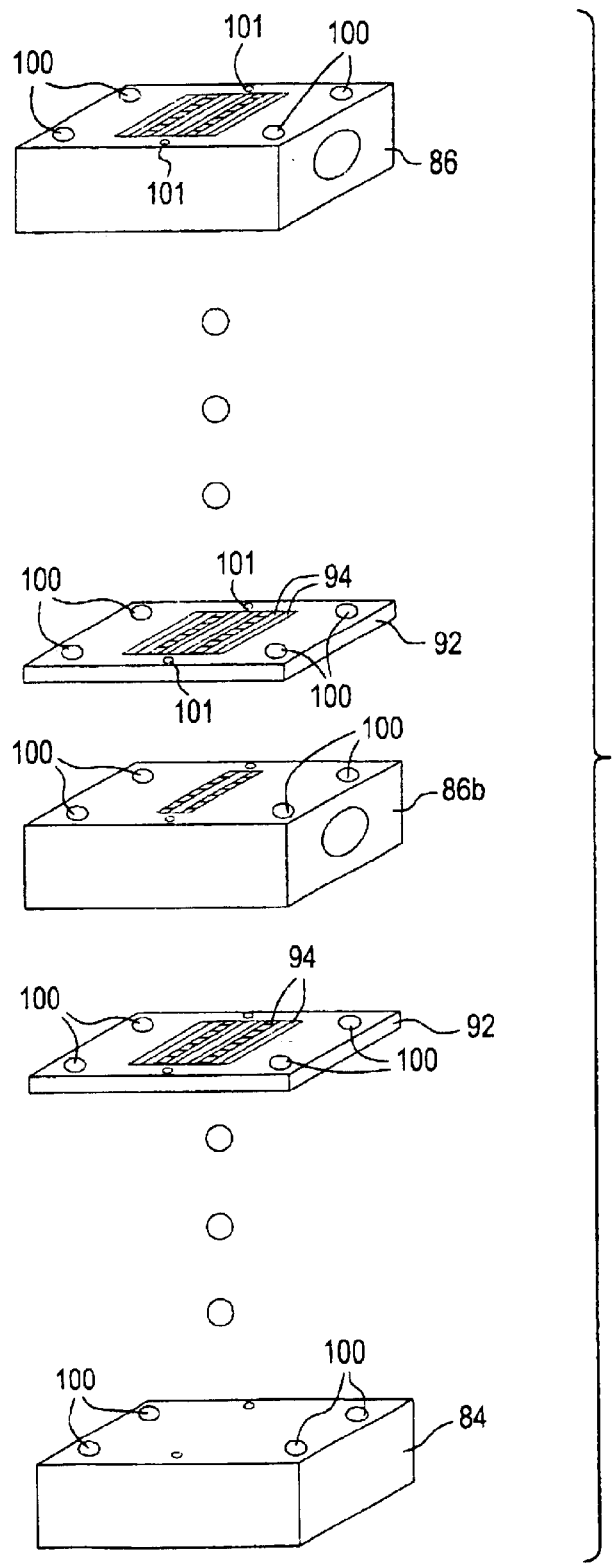
FIG. 7 is an exploded perspective view of a second embodiment of a burner manifold apparatus in accordance with the invention.

FIGS. 7–9 illustrate a second embodiment of the subject burner manifold apparatus. As shown in FIG. 8, this burner manifold apparatus, generally indicated 82, includes a base element 84 and a plurality of manifold elements 86a–86f positioned in a stacked arrangement on top of the base 84. The base 84 is preferably solid, as shown in cross section in FIG. 8. Each of the manifold elements 86a–86f has a different number of fluid passages 88, the number of fluid passages 88 increasing for each element that is closer to the top of the stack. For example, the lowermost manifold element 86a has a single fluid passage fed by a single fluid feed line through a port 90. The fluid passages are isolated from one another, two new outer fluid passages being introduced into the stacked arrangement with each successive manifold element from bottom to top. For example, manifold element 86b has three fluid passages, manifold element 86c has five fluid passages, and so on. In this manner, the fluid remains contained until it reaches the topmost manifold element 86f and the burner (not shown).

The manifold elements 86b–86f each have two ports 90 so that two fluid feed lines are needed for each of these elements 86b–86f. The ports 90 face opposite directions for each successive manifold element 86b–86f for ease of attachment of the fluid feed lines. Fluid is split evenly between the two ports 90 of each manifold element 86b–86f. This differs from the first embodiment, where a particular fluid is introduced into the burner mount via a single fluid inlet port and then split internally to opposite sides of the burner mount.

The manifold apparatus 82 of this second embodiment further comprises gaskets 92 positioned between adjacent manifold elements 86a–86f (the gaskets are not shown in FIG. 8). The gaskets 94 may, for example, be formed from an elastomer material, such as Viton, a product of DuPont Dow Elastomers. The gaskets include slots 94 that align with the fluid passages in the manifold elements 86a–86f. All of the gaskets 92 may be formed with the same number of slots 94, as illustrated by the two gaskets shown in FIG. 7; only those slots in alignment with fluid passages being used (for example, only the central slot being used for the gasket positioned between elements 86a and 86b). The slots 94, like the fluid passages 88, are rectangular in shape.

FIG. 9 shows a top view of the topmost manifold element 86f in the stacked arrangement. Here it is apparent that the fluid passages 88 are rectangular in shape, with a longitudinal axis extending between a front wall 96 of the manifold element 86f and a back wall 98. The fluid passages form a linear array such that a burner, for example, burner 58 in FIG. 1, placed on top of the topmost manifold element 86f would produce a linear flame. And, as with the first embodiment, the fluid passages are symmetric about a central fluid passage and converge at the fluid outlets of the fluid passages. In addition, the cross section of the fluid inlets are greater than the cross section of the associated fluid outlets.

The manifold elements 86a–86f may be releasably connected by four long rods (not shown), each channeled in a vertical direction through a set of bores 100 formed in each corner of the manifold elements 86a–86f, the base element 84, and the gaskets 92. The rods may be threaded on each end for receipt of a nut to secure the rod in place on the topmost manifold element 86f and the base element 84. Also shown in the top view of FIG. 9 are bores 101 for receipt of alignment pins (not shown).

Like the first embodiment, this second embodiment may be used with a micromachined burner to produce a linear flame for use during a flame hydrolysis process.

Figure 10:
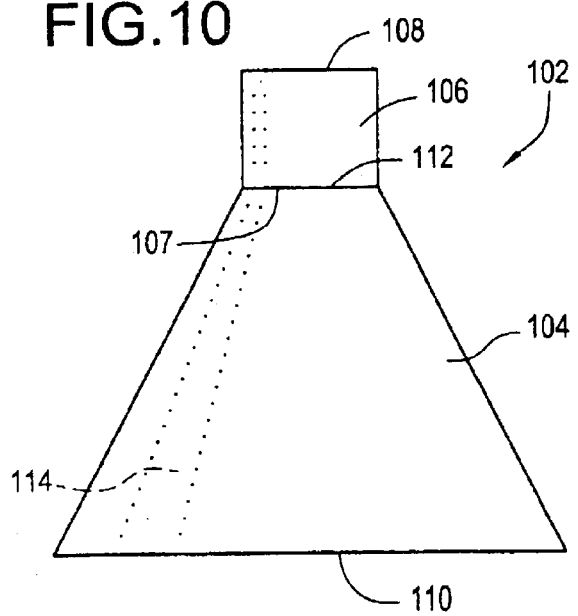
FIG. 10 is a side elevation view of a third embodiment of a burner manifold in accordance with the invention.
Figure 11:
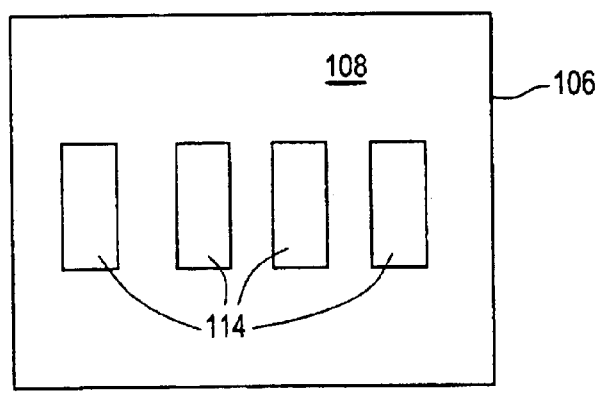
FIG. 11 is a bottom plan view of the burner manifold shown in FIG. 10.

FIGS. 10–12 show a third embodiment of the subject invention. A burner manifold, generally indicated 102, provides a web-like or honeycomb structure capable of use with micromachined silicon wafer burners. The burner manifold 102 includes a tapered section 104 and a top section 106. The top section has a first end 107 and a second end 108. A burner may be mounted to the second end 108 of the top section 106.

The tapered section 104 has a first end 110 and a second end 112. The first end 110 has a larger diameter than the second end 112. The top section 106 is coextensive with the tapered section 104; the first end 107 of the top section 106 adjoins the second end 112 of the tapered section 104.

The tapered section 104 and the top section 106 define a plurality of fluid passages 114 therethrough. The fluid passages 114 convey fluid from the first end 110 of the tapered section 104 to the second end 108 of the top section 106. The fluid passages 114 converge, yet remain isolated from each other, in the tapered section 104 and this fluid passage convergence is carried over into the top section 106, as shown in FIG. 10.

Figure 12A:
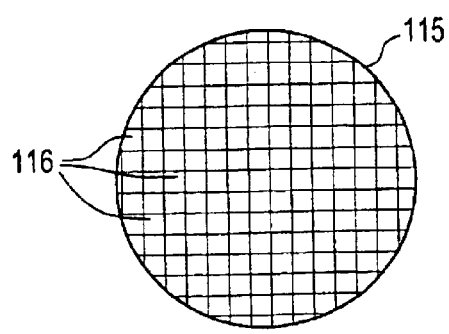
FIGS. 12A and 12B are top plan views of an alternative design for the third embodiment shown in FIG. 10.

As shown in FIG. 11, the fluid passages may have rectangular cross sections, forming slots, similar to the shape of the passages in the first two embodiments. Here, the top section 106 has a rectangular cross section; however, it will be understood that the top section 106 can have any configuration suitable for use with a micromachined burner. For example, the top section may be cylindrical, as shown in FIG. 12A and indicated 115. This cylindrical top section 115 has fluid passages 116.

Figure 12B:
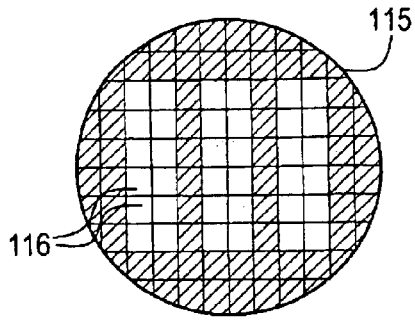

In one aspect of the invention, selected ones of the fluid passages may be filled or plugged with a fill material to block the passage of fluid therethrough. Blocking of selected fluid passages makes it possible to form fluid passages of any cross-sectional shape. For example, selected fluid passages may be blocked to form rectangular slots similar to those shown in FIG. 11, each rectangular slot being comprised of several unblocked fluid passages surrounded by blocked fluid passages, as illustrated in FIG. 12B. The unblocked passages 116, in combination, have a rectangular cross-section.

This third embodiment may also be formed with only the tapered section. The tapered section has a first end for carrying a micromachined burner and a second end, the first end having a smaller surface area than the second end. The tapered section defines a plurality of fluid passages therethrough to convey fluid from the first end to the second end, and selected ones of the fluid passages may be blocked to prevent fluid from passing therethrough.

The burner manifold 102 may be manufactured by reduction extrusion and/or hot draw down processes and preferably comprises a glass material, such as PYREX, so that a silicon burner can be bonded directly to the second end 108 via an anodic bond, alleviating the need for clamps to secure the burner to the manifold. Alternatively, the burner manifold 102 may be composed of a silica material or a ceramic material. The silica and ceramic manifolds can be formed by cold reduction extrusion.

Typically, to manufacture the manifold of FIGS. 10–12, a preform of parallel channels (honeycomb) is extruded from particulate material compounded with liquid additives. In the special case of amorphous particles that viscously sinter, the viscously sintered preform can be hot drawn down viscously to make a taper of channels, a funnel of funnels. In the general case, the particulate preform (wet-green and plastic) can be reduction extruded into a taper. The channels of the particulate preform can then be backfilled with a material, such as a polycrystalline wax, which matches the plasticity and incompressibility of the webs of the particulate preform sufficiently so as to then allow the assembled structure (plastic composite) to plastically deform in a reasonably self-similar manner as it is extruded into a die of the desired manifold shape. Suitable particulate materials include glass, ceramic, metal and/or plastics. After reduction extrusion of the backfilled honeycomb preform, the backfill is removed from the channels, and the particulate taper is sintered. With a large array of channels, selected channels can be permanently filled or plugged to conveniently create a desired flow pattern through the taper. In this manner, the ensemble of fluid passages can take on any pixelated shape, depending on which passages are blocked and which are not The backfill material may be removable (by a variety of methods) so as to leave an array of fluid passages, or it may be permanent so as to form an array of filaments, or some combination of the two.

Manufacture of this third embodiment by extrusion is a particularly convenient method for impressing a taper on a honeycomb structure, and can be carried out by forcing the honeycomb from a suitable supporting enclosure (i.e., the barrel of a ram extruder) partially into or through a tapered barrel, mold or extrusion die of a desired prismatic, conical, or other tapering form. The extrusion path preferably has an inlet cross section close in size and shape to that of the supporting enclosure for the starting honeycomb. The extrusion path preferably offers a smooth transition to an outlet or receptacle having a different cross-sectional size and/or shape, corresponding to a predetermined channel size and shape for the final honeycomb product.

Any size reduction carried out between the die inlet and outlet will dictate a corresponding increase in cell density and overall reduction in cell wall thickness in the reshaped product, while any change in outlet shape will modify the final cell shapes and/or cell wall thickness distributions in that product. Both are accomplished without any loss of channel integrity, because flow paths do not cross.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims.

What is claimed is:

1. A burner manifold apparatus for delivering reactants to a combustion site of a chemical vapor deposition process, comprising:

fluid inlets, fluid outlets, and a plurality of fluid passages extending between the fluid inlets and the fluid outlets, the fluid passages converging toward each other from the fluid inlets to the fluid outlets, wherein the fluid passages have a smaller cross section at the fluid outlets than at the fluid inlets, and at least one pressure inducing restriction device for passing fluid therethrough in narrow elongated streams, the at least one pressure inducing restriction device being positioned between the fluid inlets and the fluid outlets.

2. A burner manifold apparatus as claimed in claim 1, wherein the fluid passages are isolated from one another so that selected ones of the fluid passages transport reactant precursor materials and different selected ones of the fluid passages transport combustion materials.

3. A burner manifold apparatus as claimed in claim 1, wherein the fluid passages at the fluid outlets are slot-shaped.

4. A burner manifold apparatus as claimed in claim 1, wherein the at least one pressure inducing restriction device comprises a plate having a series of slots or linearly arrayed apertures therein for emitting fluid therefrom in generally linear streams.

5. A burner manifold apparatus as claimed in claim 1, wherein the burner manifold apparatus includes:

a manifold base having a top, a bottom, a front wall, a back wall, and two side walls,
the fluid passages including horizontal fluid passages that extend between the side walls and vertical fluid passages extending from a position within the manifold to the top of the manifold base, and
the fluid inlets including fluid inlet ports, each located on at least one of the front wall and the back wall of the manifold base and each being in fluid communication with at least one of the horizontal and vertical fluid passages;

a plate mounted to the top of the manifold base, the plate defining a plurality of apertures therethrough, at least one aperture being positioned at a location above an exit of each of the vertical fluid passages of the manifold base to allow passage of a fluid from the vertical fluid passages through the plate; and a manifold burner mount mounted to the plate,
the fluid passages further including manifold burner mount fluid passages that extend from a bottom of the manifold burner mount to a top of the manifold burner mount and terminating as the fluid outlets, the manifold burner mount fluid passages being arranged such that a distance between adjacent manifold burner mount fluid passages is greater at the bottom of the manifold burner mount than at the top of the manifold burner mount, the manifold burner mount fluid passages being arranged symmetrically about a central location on the top of the manifold burner mount.

6. A burner manifold apparatus as claimed in claim 5, wherein the vertical fluid passages are symmetric about a first axis bisecting the top of the manifold base.

7. A burner manifold apparatus as claimed in claim 5, wherein the vertical fluid passages are asymmetric about a first axis bisecting the top of the manifold base.

8. A burner manifold apparatus as claimed in claim 2, wherein the fluid passages include a central vertical passage and pairs of vertical passages, each pair defined by two vertical passages spaced equidistant from the first axis, each pair intersecting a particular horizontal fluid passage to create an array within the manifold base to distribute fluid symmetrically about the first axis.

9. A burner manifold apparatus as claimed in claim 8, wherein each pair of vertical passages and particular horizontal fluid passage is fluidly independent from each other pair of vertical passages and particular horizontal fluid passage.

10. A burner manifold apparatus as claimed in claim 5, wherein each of the horizontal fluid passages is associated with a single fluid inlet port.

11. A burner manifold apparatus as claimed in claim 5, wherein the manifold burner mount fluid passages are linear.

12. A burner manifold apparatus as claimed in claim 5, wherein the top of the manifold base includes grooves therein, each groove positioned at an exit of one of the vertical fluid passages.

13. A burner manifold apparatus as claimed in claim 12, wherein exits of the vertical fluid passages in the manifold base and corresponding grooves in the top of the manifold base are in alignment with linear entrances to the manifold burner mount fluid passages.

14. A burner manifold apparatus as claimed in claim 5, wherein the plate has a linear array of apertures, and lines of the linear array are in alignment with the exits of the vertical fluid passages in the manifold base and the linear entrances of the manifold burner mount fluid passages.

15. A burner manifold apparatus as claimed in claim 14, wherein the apertures of the plate are smaller in size than the exits of the vertical fluid passages, such that the plate operates as a pressure plate to evenly distribute fluid symmetrically throughout the manifold base.

16. A burner manifold apparatus as claimed in claim 5, and further comprising securing elements mounted to the top of the manifold burner mount for securing a burner thereto.

17. A burner manifold apparatus as claimed in claim 16, wherein the securing elements comprise a pair of clamps releasably secured on either side of the top of the manifold burner mount for securing the burner over the manifold burner mount fluid passages.

18. A burner manifold apparatus as claimed in claim 17, wherein the clamps each have an outer edge and an inner edge, the inner edge having a shoulder that engages a burner to be mounted to the manifold burner mount.

19. A burner manifold apparatus as claimed in claim 18, wherein the inner edge of each clamp has a tapered surface that tapers away from the top of the manifold burner mount.

20. A burner manifold apparatus as claimed in claim 17, further comprising a spring mounted between each clamp and the manifold burner mount.

21. A burner manifold apparatus as claimed in claim 5, wherein the manifold base, the plate, and the manifold burner mount are generally rectangular.

22. A burner manifold apparatus as claimed in claim 21, wherein the burner manifold apparatus comprises a plurality of burner mounts, a plurality of plates, and a single manifold, the single manifold having a thickness dimension between the front wall and the back wall, the thickness of the single manifold being greater than a thickness dimension of the burner mounts and the plates such that a plurality of burner mount/plate combinations may be mounted to the manifold.

23. A burner manifold apparatus as claimed in claim 5, wherein the fluid inlet ports are located on the front wall of the manifold.

24. A burner manifold apparatus as claimed in claim 5, the fluid inlet ports are located on the back wall of the manifold.

25. A burner manifold apparatus as claimed in claim 5, wherein a first set of the fluid inlet ports is located on the front wall of the manifold, and a second set of the fluid inlet ports are located on the back wall of the manifold.

26. A burner manifold apparatus as claimed in claim 1, further comprising:

a plurality of manifold elements positioned in a stacked arrangement such that fluid passages extend through the manifold elements and terminate at the fluid outlets, the manifold elements fluidly communicating with each other via the fluid passages, each of the manifold elements having a greater number of fluid passages than a manifold element stacked therebelow such that the topmost manifold element has a greatest number of fluid passages therethrough and such that the fluid passages converge at the fluid outlets.

27. A burner manifold apparatus as claimed in claim 26, wherein each of the manifold elements includes at least one fluid inlet port.

28. A burner manifold apparatus as claimed in claim 27, wherein the lowermost manifold element has a single fluid inlet port and the remaining manifold elements have two fluid inlet ports.

29. A burner manifold apparatus as claimed in claim 28, wherein, in the remaining manifold elements, fluid is split evenly between the two fluid inlet ports.

30. A burner manifold apparatus as claimed in claim 27, wherein the fluid passages are linear and extend vertically through the manifold elements.

31. A burner manifold apparatus as claimed in claim 30, wherein outermost fluid passages of each of the manifold elements communicates with the associated fluid inlet ports, and inner fluid passages are isolated from the outermost fluid passages.

32. A burner manifold apparatus as claimed in claim 31, wherein fluid passages of adjacent manifold elements are in vertical alignment.

33. A burner manifold apparatus as claimed in claim 31, wherein the inner fluid passages are vertical, rectangular slots.

34. A burner manifold apparatus as claimed in claim 27, wherein the fluid passages are symmetric about a central fluid passage.

35. A burner manifold apparatus as claimed in claim 1, further comprising:

a tapered section having a first end defining the fluid outlets and a second end defining the fluid inlets, the first end having a smaller surface area than the second end.

36. A burner manifold apparatus as claimed in claim 35, wherein selected ones of the fluid passages are blocked to prevent fluid from passing therethrough.

37. A burner manifold apparatus as claimed in claim 1, further comprising:

a tapered section having a first end defining the fluid inlets and a second end, the first end having a larger surface area than the second end; and a top section having a first end in fluid communication with the second end of the tapered section and a second end defining the fluid outlets, wherein the fluid passages extend through the tapered section and the top section to convey fluid from the first end of the tapered section to the second end of the top section.

38. A burner manifold apparatus as claimed in claim 37, wherein the top section is coextensive with the tapered section.

39. A burner manifold apparatus as claimed in claim 37, wherein the burner manifold is formed by an extrusion process.

40. A burner manifold apparatus as claimed in claim 37, wherein the burner manifold is formed by a hot draw process.

41. A burner manifold apparatus as claimed in claim 37, wherein selected ones of the fluid passages are plugged.

42. A burner manifold apparatus as claimed in claim 41, wherein the selected ones are filled with a solid material.

43. A burner manifold apparatus as claimed in claim 41, wherein the solid material is at least one of epoxy and silicone.

44. A burner manifold apparatus as claimed in claim 37, wherein the burner manifold apparatus comprises a glass material.

45. A burner manifold apparatus as claimed in claim 37, wherein the burner manifold apparatus comprises a ceramic material.

46. A burner manifold apparatus as claimed in claim 37, wherein the burner manifold apparatus comprises a silica material.

47. A burner manifold apparatus as claimed in claim 37, wherein the top section is cylindrical.

48. An arrangement of burner manifold assemblies for use in a chemical vapor deposition process, comprising:

a manifold having fluid passages therethrough and a plurality of fluid inlet ports;

a plurality of burner mounts mounted to the manifold and having fluid passages in fluid communication with the fluid passages of the manifold, the burner mounts each having a linear array of slots on a top thereof for emitting fluid therefrom, the slots of the burner mounts being in linear alignment with slots of adjacent burner mounts; and a plurality of flow restriction devices positioned between the manifold and each of the burner mounts.

49. An arrangement as claimed in claim 48, the plurality of flow restriction devices comprise a plurality of pressure plates having apertures therethrough, the apertures being in alignment with the manifold fluid passages and the burner mount fluid passages for emitting streams of fluid from the manifold into the burner mounts.

50. A burner manifold assembly for delivering reactants to the combustion site of a chemical vapor deposition process, comprising:

a burner manifold apparatus having fluid inlets, fluid outlets, and a plurality of fluid passages extending between the fluid inlets and the fluid outlets, the fluid passages converging toward each other from the fluid inlets to the fluid outlets; and a burner mounted to the burner manifold apparatus, the burner having a linear array of at least one of slots and orifices, the linear array being in fluid communication with the fluid passages at the fluid outlets.

51. A burner manifold apparatus for delivering reactants to a combustion site of a chemical vapor deposition process, comprising:

fluid inlets, fluid outlets, and a plurality of fluid passages extending between the fluid inlets and the fluid outlets, the fluid passages converging toward each other from the fluid inlets to the fluid outlets, wherein the fluid passages have a smaller cross section at the fluid outlets than at the fluid inlets, and a plurality of manifold elements positioned in a stacked arrangement such that fluid passages extend through the manifold elements and terminate at the fluid outlets, the manifold elements fluidly communicating with each other via the fluid passages, each of the manifold elements having a greater number of fluid passages than a manifold element stacked therebelow such that the topmost manifold element has a greatest number of fluid passages therethrough and such that the fluid passages converge at the fluid outlets.

* * * * *